US005565763A

United States Patent [19]
Arrendale et al.

[11] Patent Number: 5,565,763
[45] Date of Patent: Oct. 15, 1996

[54] THERMOELECTRIC METHOD AND APPARATUS FOR CHARGING SUPERCONDUCTING MAGNETS

[75] Inventors: Hubert G. Arrendale, Ramona; Sherri O. Ahlbrandt, San Diego, both of Calif.

[73] Assignee: Lockheed Martin Corporation, Bethesda, Md.

[21] Appl. No.: 154,905

[22] Filed: Nov. 19, 1993

[51] Int. Cl.$^6$ .................................................. H01F 36/00
[52] U.S. Cl. ........................................ 323/360; 505/869
[58] Field of Search ............................... 323/360; 361/19, 361/141; 505/211, 851, 867, 869, 870

[56] References Cited

U.S. PATENT DOCUMENTS

| | | | |
|---|---|---|---|
| 3,667,029 | 5/1972 | Bergmann | 323/360 |
| 3,848,162 | 11/1974 | Ichikawa et al. | 323/360 |
| 4,764,834 | 8/1988 | Jones | 361/141 |
| 4,994,932 | 2/1991 | Okamoto et al. | 361/19 |
| 5,250,508 | 10/1993 | Pham | 505/1 |

Primary Examiner—Matthew V. Nguyen
Attorney, Agent, or Firm—John R. Duncan; Frank D. Gilliam

[57] ABSTRACT

A method and apparatus for charging superconducting magnet coils using the Seebeck effect of thermoelectric materials. Superconducting magnet coils are wound from a superconducting material, such as niobium-titanium, and placed in a cryogenic dewar to cool the coil below the critical temperature at which the coil becomes superconducting. The coil can be charged by providing a suitable thermocouple junction outside the dewar and a reference thermocouple junction inside the dewar and connecting the junctions to the coil in a manner providing charging current flow to the coil in accordance with the Seebeck effect. This method is particularly desirable for use with lightweight magnet systems for use in such applications as magnetic levitation systems for trains, space applications, etc. where the present heavy switching power supplies are undesirable.

21 Claims, 1 Drawing Sheet

5,565,763

THERMOELECTRIC METHOD AND APPARATUS FOR CHARGING SUPERCONDUCTING MAGNETS

BACKGROUND OF THE INVENTION

This invention relates in general to the charging of superconducting magnet coils and, more specifically, to a method and apparatus for charging superconducting magnet coils using thermocouple junctions in accordance with the Seebeck effect.

Superconducting magnets are coming into widespread use in particle accelerators for physics research and medical applications, as energy storage devices, to provide energy for systems such as magnetically levitated trains, etc. These superconducting magnets use coils of superconducting wire cooled below the critical temperature of the wire material, at which point the wire is essentially without electrical resistance. With present superconducting materials such as niobium-titanium alloys, the coils must be cooled with liquid helium, while the so-called high temperature superconductors such as $YBa_2Cu_3O_7$ have higher critical temperatures, allowing cooling with liquid nitrogen.

Presently, such coils are electrically charged using large, heavy, power supplies and large switching systems. While these systems are very effective in charging very large, fixed, magnets such as the Superconducting Supercollider dipole magnets, they are undesirable for use in mobile systems, such as those used with magnetically levitated trains or space applications where the cost of launching the additional weight of a charging system is prohibitive.

Present charging systems require heavy leads penetrating into the magnet cooling system to charge the magnet. After charging, during magnet operation, these leads are a source of significant heat transfer into the cooling system, causing an undesirably large loss of the coolant liquid due to increased boil-off.

In past applications of thermoelectric power generation the low voltage potentials have been a disadvantage in many applications. The typical low voltage, high current characteristics of thermoelectricity is much better suited to the near zero resistance of superconducting magnets.

Thus, there is a continuing need for improved methods for charging superconducting magnet coils, especially for use in mobile or space magnet applications.

SUMMARY OF THE INVENTION

The above-noted problems, and others, are overcome by the method and apparatus of this invention, in which a magnet coil formed from a selected superconducting material is placed in a dewar containing a cryogenic liquid capable of cooling the superconducting coil below its critical temperature, placing a first thermocouple in the dewar and a second thermocouple outside, generally at room or ambient temperatures, and connecting the coil and thermocouples in series so that a current will flow through the coil to charge the coil in accordance with the Seebeck effect.

This invention avoids the large, heavy, power supplies and switching systems normally required for charging superconducting magnets. The high current cryogenic cooled leads are still required for connecting from outside to inside the superconducting coil dewar. The voltage drop across these leads can be maintained low through design.

For applications such as magnetically levitated trains, the "hot" junction can simply be at ambient, outside, temperatures. In space applications, the hot junction could be heated by solar power. This method is somewhat the opposite of that used by thermoelectric generators that use the heat of decay of radioactive materials to heat the hot junction and ambient temperatures to cool the cold junction to produce electricity to operate isolated lighthouses, buoys and the like. In principal, the cold and hot thermoelectric junctions may be located in any temperature difference such as solar heated hot junctions and cold junctions such as radiation to deep space.

BRIEF DESCRIPTION OF THE DRAWING

Details of the invention, and of certain preferred embodiments thereof, will be further understood upon reference to the drawing, wherein:

FIG. 3 is a schematic representation of a third embodiment suitable for space applications and the like.

DETAILED DESCRIPTION OF PREFERRED EMBODIMENTS

Figure 1:
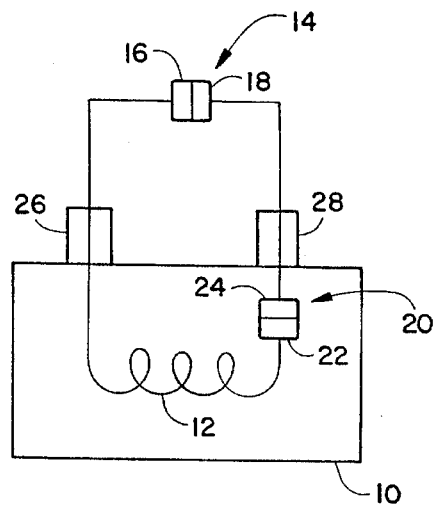
FIG. 1 is a schematic representation of a first embodiment of the invention with a cold junction in a cryogenic vessel.

Referring to FIG. 1, there is seen a simple schematic diagram illustrating a first embodiment of the apparatus. A dewar 10 contains the superconducting coil 12. Dewar 10 may have any suitable structure for maintaining coil 12 below the critical temperature of the superconductor.

Typically, where a low temperature superconductor is used, dewar 10 may include a tube surrounding the coil or other coil housing surrounded by a vessel containing liquid helium at 4° K., surrounded in turn by a vacuum chamber and a vessel containing liquid nitrogen at 77° K. Layers of superinsulation, etc., may be used as desired to further reduce transfer of outside heat into the system.

Coil 12 may be formed from any suitable superconductor. Typical superconductors include alloys such as niobium-titanium, and niobium-tin, ceramic high-temperature superconductors such as $YBa_2Cu_3O_7$. Other typical superconductors are described by Simon and Smith in "Superconductors", Plenum Press, 1988.

Dewar 10 is adapted to contain a quantity of a suitable cryogenic liquid, such as liquid helium or liquid nitrogen, selected to cool the chosen superconductor below its critical temperature.

A first thermocouple 14 made up of two dissimilar materials 16 and 18 is positioned outside dewar 10, in a warmer region than within the dewar, typically at ambient temperatures. A second thermocouple 20, made up of dissimilar materials 22 and 24 (generally the same materials as 16 and 20, respectively) is positioned within dewar 10 where it is held at cryogenic temperature. Thermocouples 14 and 20 are wired in series, with the wires entering and leaving dewar 10 through insulated lead channels 26 and 28 If desired, a plurality of first, "hot", thermocouples 14 may be arranged in series, complementing a similar parallel array of second, "cold" thermocouples 20 to increase production of electricity.

The Seebeck effect states that there is a potential difference caused by a difference in temperature between hot and cold junctions of a circuit if the circuit is made from two dissimilar metals or certain other materials. The resulting voltage is a product of the temperature difference and the difference in the Seebeck's coefficient for the materials selected. Each of thermocouples 14 and 20 is made from the same two pairs of materials, with similar materials from each pair connected together. Typical thermocouple materials include copper/constantan, iron/constantan and n and p doped bismuth telluride. Today, selected dissimilar metals are generally used in thermocouples for temperature measurement, while semiconductors having large Seebeck's coefficient are preferred for power generation. While any suitable materials may be used in thermocouples 14 and 16, semiconductors are preferred for their greater power generating rates with given temperature differences. Typical such semiconductors are bismuth telluride and silicon-germanium.

Figure 2:
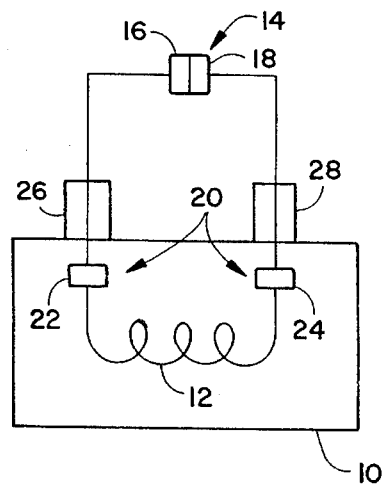
FIG. 2 is a schematic representation of a second embodiment of the invention with a divided cold junction in a cryogenic vessel.

While the thermocouple pairs of materials are generally in an abutting, full contact arrangement of the sort shown in FIG. 1, if desired they may be separated as shown in the embodiment of FIG. 2. Here the dewar 10 and coil 12 are as described above.

Thermocouple 14 and/or thermocouple 20 may be divided, with the two different materials separated by a wire. As seen, thermocouple 20 has material 22 on one side of coil 12 and material 24 on the other side. This may be advantageous where the dewar structure configuration is such that this embodiment provides placement advantages.

Figure 3:
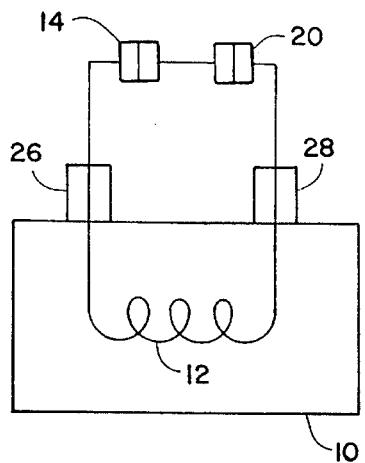

FIG. 3 shows an embodiment suitable for use in space or similar environments where both hot and cold regions are readily available. In space, the hot thermocouple 14 could be heated by solar energy while the cold thermocouple 20 could be exposed to the cold of deep space. This arrangement would provide sufficient temperature difference to charge superconducting coil 12 in dewar 10.

Other applications, variations and ramifications of this invention will occur to those skilled in the art upon reading this disclosure. Those are intended to be included within the scope of this invention, as defined in the appended claims.

We claim:

1. A method for charging a superconducting magnet coil which comprises the steps of:

providing a magnet coil formed from a superconducting material;

placing said magnet coil in a dewar filled with a cryogenic liquid capable of cooling said coil to a temperature below the critical temperature of said superconducting material;

placing at least one first thermocouple, formed from dissimilar materials, in a cold region;

placing at least one second thermocouple, formed from dissimilar materials, in a hot region; and electrically connecting said coil and said first and second thermocouples in series;

whereby a current will flow through said first and second thermocouples and said coil, charging said coil.

2. The method according to claim 1 wherein said cold region is outside said dewar.

3. The method according to claim 2 wherein said dewar is in space, said hot region is heated by solar energy and said cold region is the temperature of deep space.

4. The method according to claim 1 wherein said cold region is within said dewar and said hot region is ambient temperatures outside said dewar.

5. The method according to claim 1 wherein said thermocouples are formed from semiconducting materials.

6. The method according to claim 1 wherein said first thermocouple is divided with each of the dissimilar materials making up said thermocouple positioned on opposite ends of said coil.

7. The method according to claim 1 where a plurality of first and second thermocouples are each arranged in parallel, the parallel array of first thermocouples being connected in series with the parallel array of second thermocouples.

8. A superconducting magnet coil apparatus having means for charging the coil using the Seebeck effect, which comprises:

a magnet coil formed from a superconducting material;

a dewar surrounding said coil;

said dewar adapted to contain a cryogenic liquid capable of cooling said coil below the critical temperature of said superconducting material;

a first thermocouple means, formed from dissimilar materials, located outside said dewar;

a second thermocouple means, formed from dissimilar materials, located in a lower temperature region than said first thermocouple means;

wiring means connecting said coil and said first and second thermocouples in series;

whereby a current will flow through said first and second thermocouple means and said coil to charge said coil.

9. The apparatus according to claim 8 wherein said first thermocouple means is located in an ambient temperature region outside said dewar and said second thermocouple means is located in said dewar.

10. The apparatus according to claim 8 wherein said apparatus is adapted to operate in space and further including solar heating means for heating said first thermocouple means and means for exposing said second thermocouple means to the ambient temperature.

11. The apparatus according to claim 8 wherein said thermocouples are formed from semiconducting materials.

12. The apparatus according to claim 8 wherein said first thermocouple is divided with each of the dissimilar materials making up said thermocouple connected to opposite ends of said coil.

13. The apparatus according to claim 8 where a plurality of first and second thermocouples are each arranged in parallel, the parallel array of first thermocouples being in series with the parallel array of second thermocouples.

14. A method for charging a superconducting magnet coil which comprises the steps of:

providing a magnet coil formed from a superconducting material;

placing said magnet coil in a dewar filled with a cryogenic liquid capable of cooling said coil to a temperature below the critical temperature of said superconducting material;

placing at least one first thermocouple, formed from dissimilar materials in said dewar;

placing at least one second thermocouple, formed from dissimilar materials outside said dewar; and electrically connecting said coil and said first and second thermocouples in series;

whereby a current will flow through said first and second thermocouples and said coil, charging said coil.

15. The method according to claim 14 wherein said thermocouples are formed from semiconducting materials.

16. The method according to claim 14 wherein said first thermocouple is divided with each of the dissimilar materials making up said thermocouple positioned on opposite ends of said coil.

17. The method according to claim 14 where a plurality of first and second thermocouples are each arranged in parallel, the parallel array of first thermocouples being connected in series with the parallel array of second thermocouples.

18. A superconducting magnet coil apparatus having means for charging the coil using the Seebeck effect, which comprises:

a magnet coil formed from a superconducting material;

a dewar surrounding said coil;

said dewar adapted to contain a cryogenic liquid capable of cooling said coil below the critical temperature of said superconducting material;

a first thermocouple means, formed from dissimilar materials located outside said dewar;

a second thermocouple means, formed from dissimilar materials located inside said dewar;

wiring means connecting said coil and said first and second thermocouples in series;

whereby a current will flow through said first and second thermocouple means and said coil to charge said coil.

19. The apparatus according to claim 18 wherein said thermocouples are formed from semiconducting materials.

20. The apparatus according to claim 18 wherein said first thermocouple is divided with each of the dissimilar materials making up said thermocouple connected to opposite ends of said coil.

21. The apparatus according to claim 18 where a plurality of first and second thermocouples are each arranged in parallel, the parallel array of first thermocouples being in series with the parallel array of second thermocouples.

* * * * *